(12) United States Patent
Murayama et al.

(10) Patent No.: US 7,227,575 B2
(45) Date of Patent: Jun. 5, 2007

(54) LINEAR IMAGE SENSOR CHIP AND LINEAR IMAGE SENSOR

(75) Inventors: Jin Murayama, Miyagi (JP); Tatsuya Hagiwara, Miyagi (JP); Tetsuo Yamada, Miyagi (JP)

(73) Assignee: Fujifilm Holdings Corporation, Kanagawa (JP)

(*) Notice: Subject to any disclaimer, the term of this patent is extended or adjusted under 35 U.S.C. 154(b) by 796 days.

(21) Appl. No.: 09/892,506

(22) Filed: Jun. 28, 2001

(65) Prior Publication Data

US 2002/0051068 A1   May 2, 2002

(30) Foreign Application Priority Data

Jun. 28, 2000 (JP) .............................. 2000-194500

(51) Int. Cl.
*H04N 3/14* (2006.01)
(52) U.S. Cl. .................. 348/294; 257/443; 257/678; 348/374
(58) Field of Classification Search ........... 257/443, 257/234, 225, 81, 678, 786, 680; 258/482; 358/400, 513; 348/224.1, 294
See application file for complete search history.

(56) References Cited

U.S. PATENT DOCUMENTS

| | | | | |
|---|---|---|---|---|
| 4,736,251 A * | 4/1988 | Sasaoka | ...................... | 358/505 |
| 5,087,964 A * | 2/1992 | Hatta | ........................ | 257/680 |
| 5,220,210 A * | 6/1993 | Miwada | .................... | 257/443 |
| 5,249,055 A * | 9/1993 | Masuda et al. | ............ | 348/311 |
| 5,648,653 A * | 7/1997 | Sakamoto et al. | ....... | 250/208.1 |
| 5,773,814 A * | 6/1998 | Phillips et al. | .......... | 250/208.1 |
| 5,841,554 A * | 11/1998 | Hasegawa | ................... | 358/514 |
| 6,011,294 A * | 1/2000 | Wetzel | ....................... | 257/434 |
| 6,022,792 A * | 2/2000 | Ishii et al. | .................. | 438/462 |
| 6,037,655 A * | 3/2000 | Philbrick et al. | .......... | 257/680 |
| 6,078,685 A * | 6/2000 | Kawai et al. | ............... | 382/167 |
| 6,472,247 B1 * | 10/2002 | Andoh et al. | ................. | 438/64 |

* cited by examiner

*Primary Examiner*—Ngoc-Yen Vu
*Assistant Examiner*—Gary C. Vieaux
(74) *Attorney, Agent, or Firm*—Arent Fox LLP

(57) ABSTRACT

A linear image sensor chip is manufactured by forming an image pickup section, peripheral circuit sections, a plurality of bonding pads, and a light-suppressing layer on a semiconductor substrate having an elongated shape. In this case, each of the bonding pads is formed outer than photodiode groups in the image pickup section along a longitudinal direction of the semiconductor substrate. Even if the dynamic range of an image reader utilizing such a linear image sensor chip is broadened, it is possible to suppress generation of noises without lowering the sensitivity.

14 Claims, 9 Drawing Sheets

LINEAR IMAGE SENSOR CHIP AND LINEAR IMAGE SENSOR

This application is based on Japanese Patent Application 2000-194500 filed on Jun. 28, 2000, the entire contents of which are incorporated herein by reference.

BACKGROUND OF THE INVENTION a) Field of the Invention

The present invention relates to a linear image sensor chip and a linear image sensor, and more particularly to a linear image sensor chip and a linear image sensor for reading an image.

In this specification, a linear sensor for reading an image is called a "linear image sensor", and a semiconductor substrate having an image pickup section for a linear image sensing is called a "linear image sensor chip".

b) Description of the Related Art

A linear image sensor used for various apparatus such as facsimiles, electronic copiers, image scanners and bar code readers is constituted of a linear image sensor chip (hereinafter abbreviated to "LIS chip") and a package accommodating the LIS chip.

An LIS chip has an elongated semiconductor substrate, an image pickup section formed on the semiconductor substrate, peripheral circuit sections, and a plurality of bonding pads.

The image pickup section includes at least one photodiode group and a charge transfer element provided for each photodiode group. Most LIS chips have horizontal or vertical overflow drains for draining electric charges in photodiodes. A horizontal overflow drain is formed in the image pickup section.

The number of photodiode groups to be formed in the image pickup section is changed with application, performance and the like of the linear image sensor. An LIS chip used for a linear image sensor for taking a black and white image has generally one or two photodiode groups, whereas an LIS chip used for a linear image sensor for taking a color image has, for example, three photodiode groups.

Each photodiode group is composed of a plurality of photodiodes formed in one surface of an elongated semiconductor substrate and disposed on one line along a longitudinal direction of the semiconductor substrate. The number of photodiodes constituting one photodiode group changes with application, performance and the like of the linear image sensor.

For example, some LIS chip used for an image scanner has only about 256 photodiodes. In an LIS chip used for a facsimile, an electronic copier and the like, each photodiode group has about 2,000 or more photodiodes and some group have more than 10,000 photodiodes.

The charge transfer element is made of, for example, a CCD (charge coupled device). A charge transfer element made of a CCD includes a charge transfer channel formed in the semiconductor substrate and a number of transfer electrodes formed on an electrically insulating layer on the charge transfer channel.

In order to control transfer of electric charges from a photodiode to a charge transfer element, a readout gate is formed for each photodiode. For example, the readout gate is constituted of a readout gate channel formed in the semiconductor substrate and a readout gate electrode formed on an electrically insulating layer on the readout gate channel. The readout gate electrode may be formed separately from a transfer electrode constituting the charge transfer element, or may be formed as a portion of the transfer electrode constituting the charge transfer element.

The peripheral circuit includes at least one output amplifier electrically connected to an output terminal of the charge transfer element formed in the image pickup section.

The bonding pads are formed along the peripheral area of the semiconductor substrate either in the central area of the LIS chip or in the opposite end areas along the longitudinal direction. The number of bonding pads is approximately 16 to 48 excepting those used for product test.

Each of bonding pads for external connection has an exposed surface. The bonding pads used only for product test have in some cases a monochromatic light-suppressing layer formed thereon.

A package for accommodating an LIS chip has a bottom portion, sidewall portions and a lid portion. The bottom and sidewall portions are made of light shielding material. The lid portion has a window made of transparent material.

The lid portion with the window may be constituted of a glass lid and light shielding material covering the peripheral area of the glass lid.

A plurality of lead electrodes passes through the sidewall portions from the inner space to outer space of the package.

Each lead electrode is electrically connected to a corresponding bonding pad by a bonding wire.

A dynamic range of a general image reader utilizing a linear image sensor is about 40 to 50 dB. A dynamic range of a high-grade image reader utilizing a linear image sensor, e.g., an image reader used for forming a print original, is about 60 to 70 dB or more.

Because of a high dynamic range of the high-grade image reader utilizing a linear image sensor, even small noises, which cannot be detected by the general image reader, are detected.

Noises generated in the linear image sensor can be reduced to some extent during processing a signal output from the linear image sensor to obtain an image signal. However, even in this case, a conventional high-grade image reader sometimes has local ghost-like noises on a reproduced image or picture.

An image reader having a broader dynamic range is desired nowadays. It has been desired to further suppress generation of noises in a LIS chip or a linear image sensor.

SUMMARY OF THE INVENTION

It is an object of the present invention to provide an LIS chip capable of facilitating to assemble a linear image sensor hard to generate noises.

It is another object of the present invention to provide a linear image sensor hard to generate noises.

The present inventor has vigorously studied the cause of local ghost-like noises of an image reader utilizing a linear image sensor and having a broader dynamic range, and has the following conclusion.

Bonding pads having exposed surfaces are disposed sideward along a photodiode group as in the case of a conventional LIS chip having bonding pads in a chip central area and also in the case of a conventional LIS chip having bonding pads in opposite end areas in the chip longitudinal direction.

Therefore, in a conventional linear image sensor, a fraction of light entered from the window of the package is reflected at the exposed surface of the bonding pads, and a fraction of the reflected light is reflected at the inner surface of the window or lid portion and becomes incident upon photodiodes. Ghost-like noises are therefore locally generated.

In this specification, "bonding pads disposed sideward along a photodiode group" are intended to mean the bonding pads disposed, as viewed in plan, outside of the photodiode group in the width direction of the semiconductor substrate.

If the area of the window of the package is reduced, generation of the above-described noises can be suppressed. However, as the area of the window is reduced, the amount of light incident upon a photodiode group is reduced so that the sensitivity of the linear image sensor lowers.

According to one aspect of the present invention, there is provided a linear image sensor chip comprising: a semiconductor substrate having an elongated shape; an image pickup section formed on said semiconductor substrate, said image pickup section including (i) at least one photodiode group composed of a plurality of photodiodes formed in one surface of said semiconductor substrate along a longitudinal direction of said semiconductor substrate and (ii) a charge transfer element provided for each said photodiode group; a peripheral circuit section formed on said semiconductor substrate and disposed outer than said image pickup section with respect to the longitudinal direction; a plurality of bonding pads formed on the surface of said semiconductor substrate outer than said at least one photodiode group with respect to the longitudinal direction, each of said bonding pads having an exposed surface; a plurality of metal lines formed on the surface of said semiconductor substrate, each of said metal lines having an end connected to one of said bonding pad and another end connected to said peripheral circuit or said charge transfer element; and a light-suppressing layer formed above said semiconductor substrate and covering a peripheral area of each said photodiode.

According to another aspect of the invention, there is provided a linear image sensor, comprising: a package including a bottom portion, sidewall portions and a lid portion generally defining an elongated inner space, and a plurality of lead electrodes, said lead electrodes extending from an end region of said elongated inner space, passing through said sidewall portions, and reaching an external space, said bottom portion and said sidewall portions being made of light shielding material and said lid portion having an elongated window made of transparent material; a linear image sensor chip fixed in the inner space of said package, said linear image sensor chip including (1) a semiconductor substrate having an elongated shape along a direction generally coincident with the longitudinal direction of said bottom portion, (2) an image pickup section formed on said semiconductor substrate, said image pickup section including (i) at least one photodiode group composed of a plurality of photodiodes formed in one surface of said semiconductor substrate along a longitudinal direction of said semiconductor substrate and (ii) a charge transfer element provided for each said photodiode group, (3) a peripheral circuit section formed on the semiconductor substrate and disposed outer than said image pickup section with respect to the longitudinal direction of said semiconductor substrate, (4) a plurality of bonding pads formed on the surface of said semiconductor substrate outer than said at least one photodiode group with respect to the longitudinal direction of said semiconductor substrate, each of said bonding pads having an exposed surface, (5) a plurality of metal lines formed on the surface of said semiconductor substrate, each of said metal lines having an end connected to one of said bonding pads and another end connected to said peripheral circuit or said charge transfer element, (6) a light-suppressing layer formed above said semiconductor substrate and covering a peripheral area of each said photodiode; and a plurality of bonding wires each electrically connecting one of said lead electrodes to a predetermined one of said bonding pads.

In an LIS chip, each bonding pad having an exposed surface is formed outer than photodiode groups along the longitudinal direction of the semiconductor substrate. In a linear image sensor assembled with such an LIS chip, light reflected at the exposed surfaces of the bonding pads are suppressed from becoming incident upon photodiodes. Even if the dynamic range of an image reader utilizing such a linear image sensor is broadened, it is possible to suppress generation of noises without lowering the sensitivity.

By disposing each bonding pad in the manner described above, it may become necessary to elongate the semiconductor substrate. However, even in this case, by devising the overall layout of the peripheral circuit sections, it is possible to obtain a proper LIS chip by elongating the substrate a little.

DETAILED DESCRIPTION OF THE PREFERRED EMBODIMENTS

Figure 1:
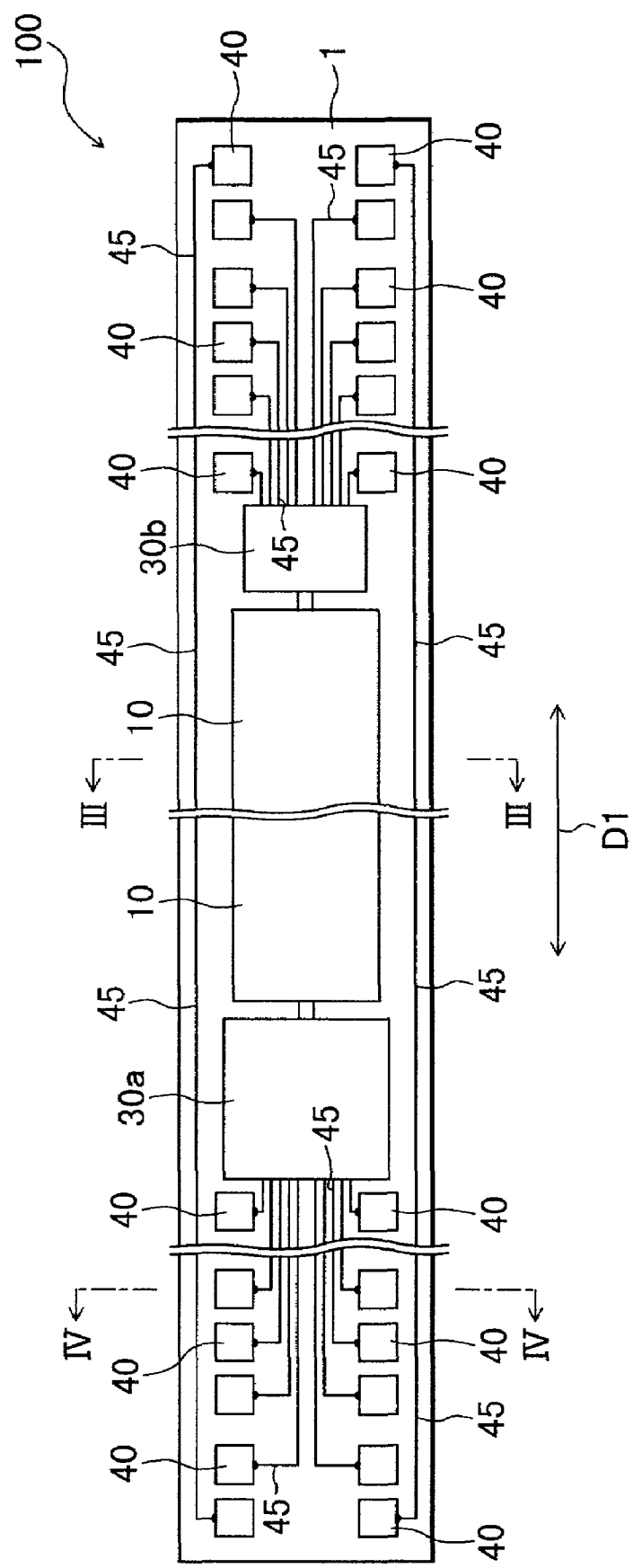
FIG. 1 is a schematic plan view showing an LIS chip according to an embodiment.

FIG. 1 is a schematic plan view showing an LIS chip according to an embodiment.

As shown in FIG. 1, this LIS chip 100 has an image pickup section 10, two peripheral circuit sections 30a and 30b, and a plurality of bonding pads 40, respectively formed on a semiconductor substrate 1. A light shielding layer, a light-suppressing layer and a plurality of color filter arrays not shown and omitted in FIG. 1 are also formed over the semiconductor substrate 1.

The semiconductor substrate 1 is made of an n-type semiconductor substrate having a p-type impurity diffused region formed on one surface of the n-type semiconductor substrate. The semiconductor substrate 1 has an elongated shape as viewed in plan. The longitudinal direction of the semiconductor substrate 1 is indicated by an arrow D1 in FIG. 1.

The image pickup section 10 is formed on the semiconductor substrate 1 in the central area thereof along the longitudinal direction as viewed in plan. This image pickup section 10 includes four photodiode groups, four charge transfer elements, and four horizontal overflow drains, respectively not shown and omitted in FIG. 1. Each charge transfer element is provided for each photodiode group and formed along the photodiode group. Each horizontal overflow drain is also provided for each photodiode group and formed along the photodiode group.

Each of the peripheral circuit sections 30a and 30b is formed at the position outer than the image pickup section 10 along the longitudinal direction of the semiconductor substrate 1. The peripheral circuit section 30a includes output amplifiers to be later described, and the peripheral circuit section 30b includes various circuits for product test.

Each bonding pad 40 is formed at the position outer than the peripheral circuit sections 30a and 30b along the longitudinal direction of the semiconductor substrate 1. Each bonding pad 40 is made of, for example, aluminum, aluminum alloy which contains silicon or copper, or alloy whose main component is copper. The size of each bonding pad 40 is, for example, about 50 µm×50 µm to 100 µm×100 µm as viewed in plan.

Each of the bonding pads 40 has an exposed surface. All the bonding pads having an exposed surface are formed in the outer areas than the area in which the photodiode groups are located. Further, it is preferable to locate the bonding pads outside the peripheral circuit sections 30a and 30b with respect to the longitudinal direction of the semiconductor substrate 1.

Each bonding pad 40 is electrically connected to a corresponding member by a metal line 45 made of aluminum or the like.

Figure 2:
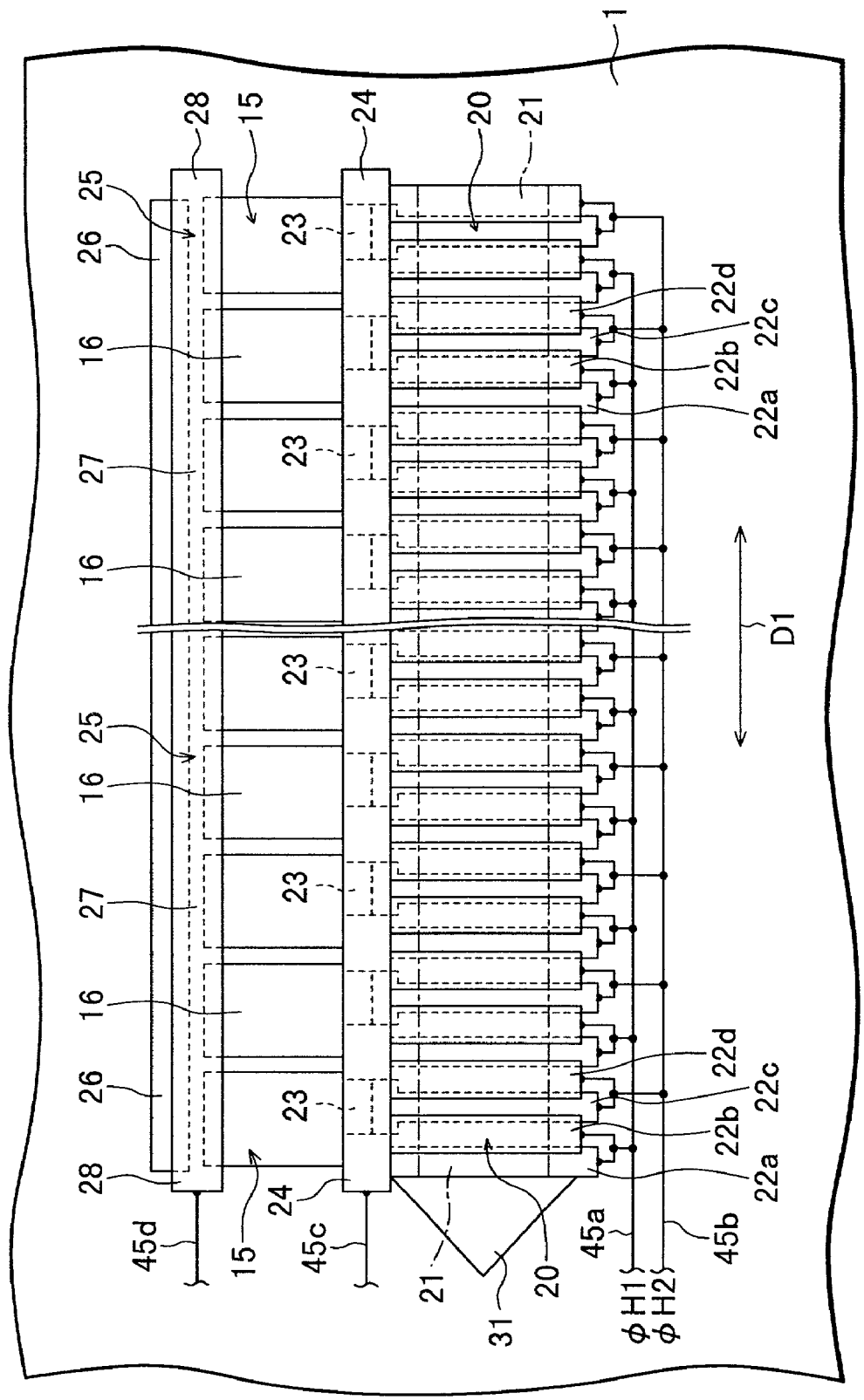
FIG. 2 is a schematic plan view showing one photodiode group and its peripheral area, the photodiode group being formed in an image pickup section of the LIS chip shown in FIG. 1.

FIG. 2 is a schematic diagram showing a photodiode group 15 formed in the image pickup section 10, a charge transfer element 20 formed along the photodiode group 15, and a horizontal overflow drain 25 formed along the photodiode group 15.

The photodiode group 15 is composed of a plurality of photodiodes 16, e.g., about 2,000 to 10,000 photodiodes, and is formed in one surface of the semiconductor substrate 1 on one line along the longitudinal direction D1 thereof. A channel stop region not shown and omitted in FIG. 2 is formed between adjacent two photodiodes 16 and in opposite areas outer than the photodiode train along the longitudinal direction.

The charge transfer element 20 is made of a CCD of a two-phase drive type. This charge transfer element 20 includes one charge transfer channel 21 formed in the semiconductor substrate 1 and a number of transfer electrodes 22a, 22b, 22c and 22d formed on an electrically insulating layer (not shown) on the semiconductor substrate 1.

The charge transfer channel 21 is formed by an n-type impurity diffused region along the longitudinal direction of the semiconductor substrate.

The transfer electrodes 22a, 22b, 22c and 22d are juxtaposed along the longitudinal direction D1 and cover as viewed in plan a partial area of the charge transfer channel 21. The transfer electrodes 22a and 22c are formed on the electrically insulating layer over the charge transfer channel 21.

For example, the transfer electrodes 22a and 22c are made of a first polysilicon layer and the transfer electrodes 22b and 22d are made of a second polysilicon layer. The surface of each of the transfer electrode 22a, 22b, 22c and 22d is covered with an electrically insulating layer made of, e.g., a thermal oxidation layer.

The transfer electrodes 22a, 22b, 22c and 22d have a so-called overlapping transfer electrode structure. As viewed in FIG. 2, the right border areas of the transfer electrodes 22b and 22d overlap the left border areas of the transfer electrodes 22a and 22c, and the left border areas of the transfer electrodes 22b and 22d overlap the right border areas of the left transfer electrodes 22a and 22c.

Each of the transfer electrodes 22a, 22b, 22c and 22d is provided for each photodiode 16 and repetitively disposed in this order from the left to right in FIG. 2.

The transfer electrodes 22a and 22b are electrically connected to a metal line 45a, and the transfer electrodes 22c and 22d are electrically connected to a metal line 45b.

A readout gate channel 23 is provided for each photodiode 16, being formed between the photodiode and charge transfer element 20 (charge transfer channel 21) as viewed in plan.

Each readout gate channel 23 is made of a partial area of the p-type impurity diffused region of the semiconductor substrate 1, and is positioned adjacent to the corresponding photodiode 16. The channel stop region not shown and omitted is formed between adjacent two readout gate channels along the longitudinal direction D1. These readout gate channels 23 are covered by one readout gate electrode 24.

The readout gate electrode 24 is formed on an electrically insulating layer (not shown) over the semiconductor substrate 1 and extends along the longitudinal direction D1. A region of the readout gate electrode 24 covering the readout gate channel 23 as viewed in plan and the underlying readout gate channel 23 constitute one readout gate. For example, the readout gate electrode 24 is made of the second polysilicon layer, and the surface thereof is formed with an electrically insulating layer such as a thermal oxidation layer. A metal line 45c is electrically connected to one end of the readout gate electrode 24.

The horizontal overflow drain 25 includes a drain region 26 and a drainage channel region 27 formed in the semiconductor substrate 1 and a drainage gate electrode 28 formed on an electrically insulating layer over the semiconductor substrate 1.

For example, the drain region 26 is made of the $n^+$-type impurity diffused region formed in the semiconductor substrate 1. The drain region 26 is formed spaced apart from the photodiode group 15 by a predetermined distance and extends along the longitudinal direction D1.

The drainage channel region 27 is made of a partial region of a p-type impurity diffused region in the semiconductor substrate 1. This drainage channel region 27 is formed between and adjacent to the photodiode group 15 and drain region 26 as viewed in plan and extends along the longitudinal direction D1.

The drainage gate electrode 28 extends along the longitudinal direction D1, covering as viewed in plan a border area of the drain region 26 on the photodiode group 15 side, the drainage channel region 27 and the boarder area of each photodiode 16 on the drain region 26 side.

A region of the drainage gate electrode 28 covering as viewed in plan the drainage channel region 27 and the underlying drainage channel region 27 constitute a drainage gate. For example, the drainage gate electrode 28 is made of the first or second polysilicon layer, and the surface thereof is formed with an electrically insulating layer such as a thermal oxidation layer. A metal line 45d is electrically connected to one end of the drainage gate electrode 28.

An output amplifier 31 is disposed at the left side end, as viewed in FIG. 2, of the charge transfer element 20. The output amplifier 31 is located in the peripheral circuit section 30a (refer to FIG. 1).

As light becomes incident upon the photodiode 16, charge is accumulated in the photodiode 16. As predetermined voltages are applied to the transfer electrodes 22a, 22b, 22c and 22d and the readout gate electrode 24, the charge accumulated in the photodiode 16 is transferred via the readout gate to the charge transfer element 20.

In this case, potential wells are formed in the charge transfer channel 21 under the transfer electrodes 22a and 22c, whereas potential barriers are formed in the charge transfer channel 21 under the transfer electrodes 22b and 22d. The charge accumulated in the photodiode 16 is transferred to the potential well formed under the transfer electrode 22c corresponding to the photodiode 16.

As a drive signal $\phi$H1 is applied to the metal line 45a and a drive signal $\phi$H2 is applied to the metal line 45b, the charges in the charge transfer element 20 can be transferred toward the output amplifier 31. The drive signals $\phi$H1 and $\phi$H2 have reversed phases each other.

For example, the output amplifier 31 converts signal charge transferred from the charge transfer element 20 into a signal voltage by using a floating capacitor (not shown), and amplifies this signal voltage by using a source follower circuit (not shown) or the like. The charge in the floating capacitor after the signal voltage detection (conversion) is absorbed to a power supply (not shown) via a reset transistor not shown and omitted in FIG. 2.

When the charges accumulated in the photodiodes 16 are to be drained, a predetermined voltage is applied to the drainage gate electrode 28. The charges accumulated in the photodiodes 16 are therefore drained to the drain region 26.

Figure 3:
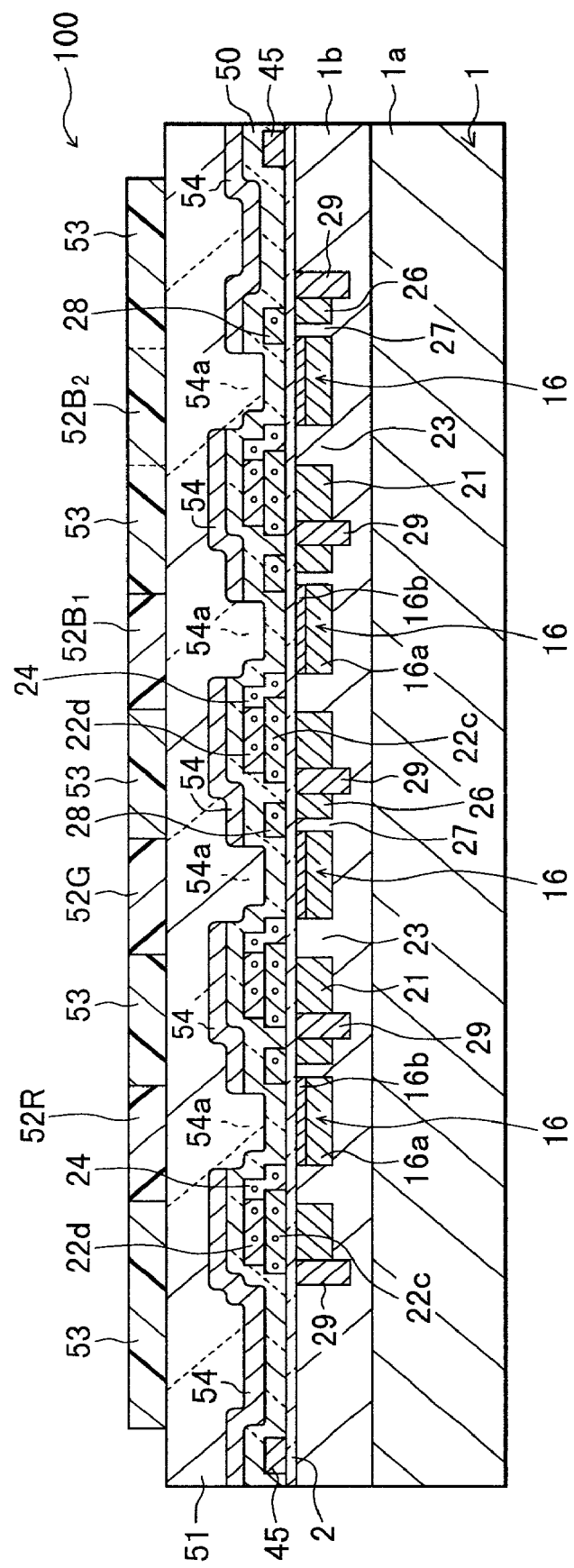
FIG. 3 is a schematic cross sectional view taken along line III-III shown in FIG. 1.

FIG. 3 is a schematic cross sectional view taken along line III-III shown in FIG. 1. Constituent elements shown in FIG. 3 and already described with reference to FIG. 1 or 2 are represented by identical reference symbols to those used in FIG. 1 or 2, and the description thereof is omitted.

As shown in FIG. 3, the semiconductor substrate 1 is made of an n-type semiconductor substrate 1b having a p-type impurity diffused region 1b formed on one surface of the n-type semiconductor substrate 1a.

As already described with reference to FIG. 1, the LIS chip 100 has four photodiode groups in total, including: a photodiode group including a first photodiode 16 as counted from the left side in FIG. 3; a photodiode group including a second photodiode 16; and a photodiode group including a third photodiode 16, respectively for taking a color image; and a photodiode group including a fourth photodiode 16 for taking a black and white image.

Each photodiode 16 is a buried type photodiode including an n-type impurity diffused region 16a formed in a predetermined area of the p-type impurity diffused region 1b and a p-type impurity diffused region 16b formed on the n-type impurity diffused region 16a.

If the size and shape as viewed in plan of each n-type impurity diffused region 16a are 8 $\mu$m×8 $\mu$m to 8 $\mu$m×10 $\mu$m and generally rectangular shape and one photodiode group is composed of about 10,000 photodiodes 16, then an LIS chip capable of realizing an image reader having a dynamic range of about 80 dB can be obtained. The size as viewed in plan of the semiconductor substrate 1 is, for example, about 1 mm×100 mm.

The drain region 26 and charge transfer channel 21 adjacent to each other along a direction crossing, as viewed in plan, the longitudinal direction of the semiconductor substrate 1 are electrically separated by the channel stop region 29. The channel stop region 29 is also formed along the leftmost charge transfer channel 21 in FIG. 3 on the left side thereof. Similarly, the channel stop region 29 is formed along the rightmost drain region 26 in FIG. 3 on the right side thereof.

An electrically insulating layer 2 is formed on the surface of the semiconductor substrate 1. For example, this electrically insulating layer 2 is made of a thermal oxidation layer, a silicon oxide layer formed by chemical vapor deposition, a deposition of a silicon oxide layer and a silicon nitride layer, or a deposition of a silicon oxide layer, a silicon nitride layer, and a silicon oxide layer, respectively formed in this order from the surface of the semiconductor substrate 1 side.

Each of the transfer electrodes 22a, 22b, 22c and 22d (only the transfer electrodes 22c and 22d are shown in FIG. 3), each readout gate electrode 24, each drainage gate electrode 28 and each metal line 45 are formed on the electrically insulating layer 2.

A passivation layer 50 covers the surfaces of each of the transfer electrodes 22a, 22b, 22c and 22d, each readout gate electrode 24, each drainage gate electrode 28 and each metal line 45 and the surface of the electrically insulated layer 2 where these electrodes and metal lines are not formed. For example, the passivation layer 50 is made of silicon nitride, silicon oxide, PSG (phosphosilicate glass), BPSG (borophosphosilicate glass), polyimide or the like.

A light shielding layer 54 is formed on the passivation layer 50, the light shielding layer 54 having an opening 54a corresponding to each photodiode 16. For example, the light shielding layer 54 is made of: metal such as aluminum, aluminum alloy, tungsten, tungsten alloy and titanium; titanium nitride; or the like.

The light shielding layer 54 is not an essential constituent member of the LIS chip 100. The light shielding layer 54 is dispensable when the light-suppressing layer 53 which will be described later is provided.

A planarized layer 51 is formed on the light shielding layer 54 and on the passivation layer 50 exposed through the openings 54a of the light shielding layer 54. For example, this planarized layer 51 is made of: transparent resin such as photoresist and polyimide; PSG; BPSG; or the like.

A color filter array constituted of color filters of a predetermined color is formed over each photodiode array.

For example, a color filter array 52R constituted of a red color filter is formed over a photodiode group including a first photodiode 16 as counted from the left in FIG. 3, and a color filter array 52G constituted of a green color filter is formed over a photodiode group including a second photodiode 16 as counted from the left in FIG. 3. A color filter array $52B_1$ constituted of a blue color filter is formed over a photodiode group including a third photodiode 16 as counted from the left in FIG. 3, and a color filter array $52B_2$ constituted of a blue color filter is formed over a photodiode group including a rightmost photodiode 16 as in FIG. 3.

In place of the color filter array $52B_2$, a color filter array may be used which is constituted of color filters of red, green, other chromatic color, or achromatic color different from black.

For example, these color filter arrays 52R, 52G, $52B_1$ and $52B_2$ can be manufactured by forming a color resin layer containing pigment or dye of a desired color on the planarized layer 51 in desired areas by a photolithography method or the like. The color filter arrays $52B_1$ and $52B_2$ may be made of the same material or different materials.

In this specification, the "color filter array" may be a color filter array constituted of color filters formed above respective photodiodes of one photodiode group or a color filter array constituted of one stripe color filter covering as viewed in plan respective photodiodes of one photodiode group. The color filter arrays 52R, 52G, 52B$_1$ and 52B$_2$ shown in FIG. 3 are of the latter type.

The area near each photodiode 16 is covered as viewed in plan with a light-suppressing layer 53. It is sufficient that the light-suppressing layer 53 can suppress propagation of light toward the semiconductor substrate 1 and may not perfectly intercept propagation of light toward the semiconductor substrate 1. Therefore, the light-suppressing layer 53 can be made of a colored layer having a desired color, e.g., a chromatic color such as red, green and blue, an achromatic color or the like. The light-suppressing layer 53 shown in FIG. 3 is made of the same material as the color filter array 52B$_2$ and formed by the same process as that of the color filter array 52B$_2$.

If the color filter array is made of one color filter of a stripe shape, a portion of the color filter array positioned as viewed in plan in the area near each photodiode functions as the light-suppressing layer.

The outer borders of the light-suppressing layer 53 reach as viewed in plan the outside of the image pickup section 10 (refer to FIG. 1) along a direction crossing as viewed in plan the longitudinal direction of the semiconductor substrate 1. The outer borders of the light-suppressing layer 53 reach as viewed in plan the outer sides of the peripheral circuit sections 30a and 30b along the longitudinal direction of the semiconductor substrate.

Although the light-suppressing layer 53 shown in FIG. 3 does not cover as viewed in plan the metal line 45, it is preferable that the light-suppressing layer 53 covers as viewed in plan the metal line 45 especially when the light shielding layer 54 is not provided. In this case, the light-suppressing layer 53 may have overhanging regions in both sides of the metal line 45 along the line width direction of the metal line 45.

The width W of an overhanging region of the light-suppressing layer 53 covering as viewed in plan the metal line 45 is preferably represented by a formula $W \geq 2e$. The term "e" represents a distance between an upper surface of the metal line 45 and a lower surface of the light-suppressing layer 53.

Figure 4:
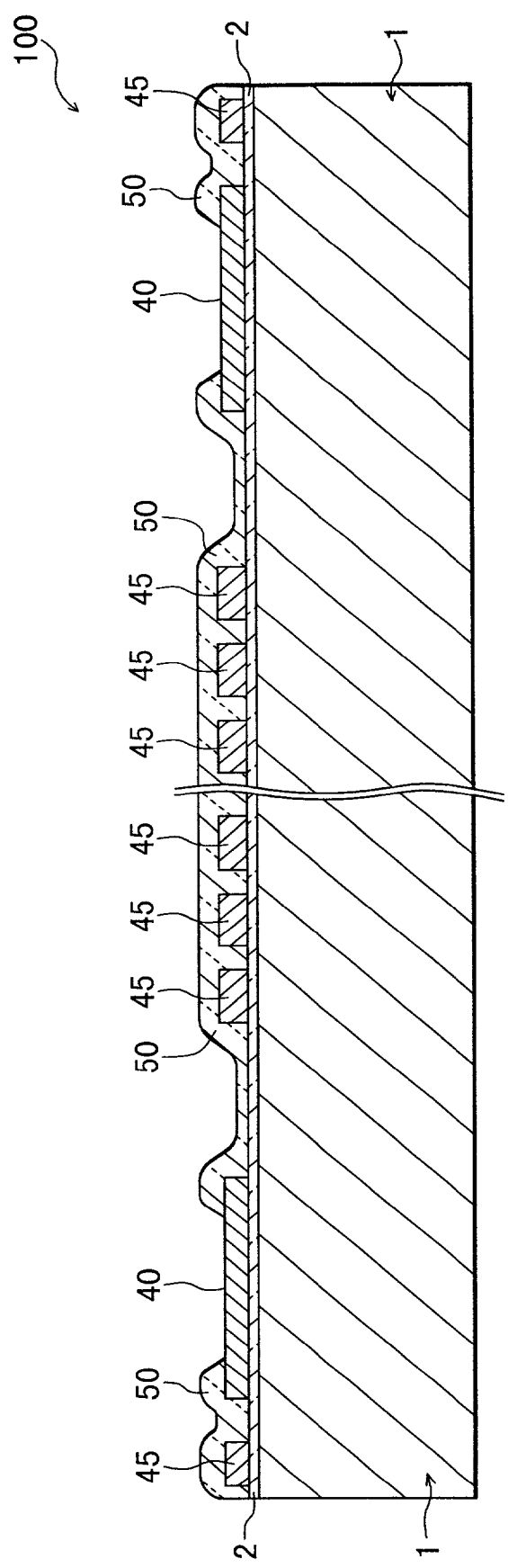
FIG. 4 is a schematic cross sectional view taken along line IV-IV shown in FIG. 1.

FIG. 4 is a schematic cross sectional view taken along line IV-IV shown in FIG. 1. In FIG. 4, the structure in the semiconductor substrate 1 is not shown and omitted. Of the constituent elements shown in FIG. 4, those already described with reference to FIG. 1 or 3 are represented by identical reference symbols to those used in FIG. 1 or 3, and the description thereof is omitted.

As shown in FIG. 4, on the electrically insulating layer 2 formed on the surface of the semiconductor substrate 1, bonding pads 40 and metal lines 45 are disposed.

The passivation layer 50 covers the surfaces of the bonding pads 40 and metal lines 45 and the surface of the electrically insulating layer 2 not formed with the bonding pads 40 and metal lines 45, excepting the surface of the central area as viewed in plan of each bonding pad 40.

The light shielding layer 54, planarized layer 51, color filter arrays 52R, 52G, 52B$_1$ and 52B$_2$ and light-suppressing layer 53 shown in FIG. 3 are not formed in this area. However, it is preferable that the light shielding layer 54 or the light-suppressing layer 53, as viewed in plan, covers the metal lines 45 and the edge portion of each bonding pad 40 to suppress a generation of noise signal in LIS chip 100 or to improve the S/N ratio of the LIS chip 100.

Each bonding pad 40 has an exposed surface of the central area as viewed in plan.

In the LIS chip 100 having the above-described structure, each bonding pad 40 is formed outer than the photodiode group 15 along the longitudinal direction of the semiconductor substrate 1. Therefore, when the LIS chip 100 is assembled as a linear image sensor, light reflected at the surfaces of the bonding pads 40 can be suppressed from becoming incident upon the photodiodes 16. Even if the dynamic range of an image reader utilizing the LIS chip 100 is broadened, generation of noises can be suppressed without lowering the sensitivity.

Next, a linear image sensor will be described with reference to the accompanying drawings.

Figure 5:
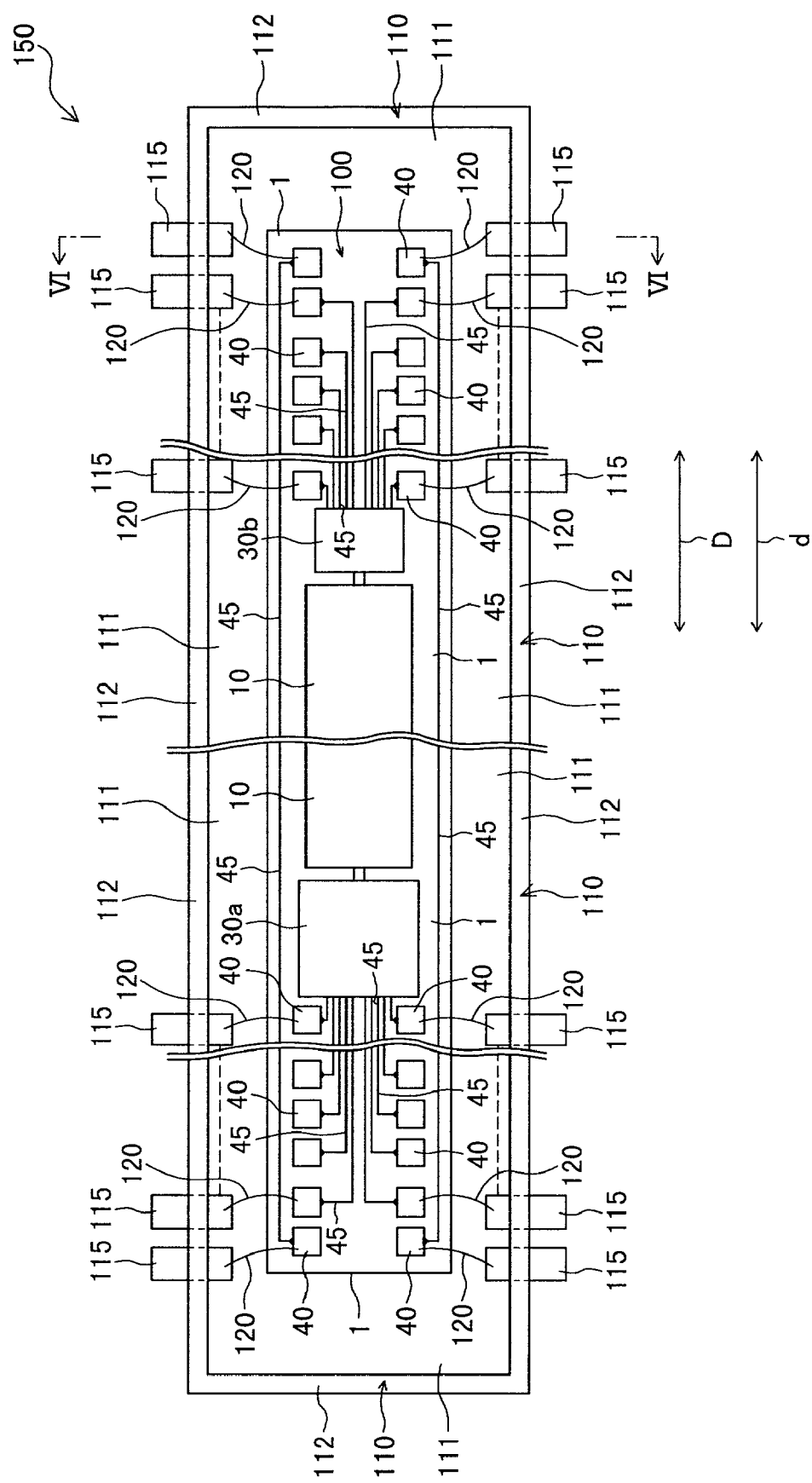
FIG. 5 is a schematic plan view showing the inside of a linear image sensor according to the embodiment.

FIG. 5 is a schematic plan view showing the inside of a linear image sensor according to the embodiment. The linear image sensor 150 shown in FIG. 5 has an LIS chip 100 of the above-described embodiment, a package 110 housing the LIS chip 100, and a plurality of bonding wires 120.

Of the constituent elements shown in FIG. 5, those already described are represented by identical reference symbols to those used in FIG. 1, and the description thereof is omitted. The LIS chip 100 shown in FIG. 5 is drawn by omitting the passivation layer 50 shown in FIGS. 3 and 4 and the light shielding layer 54, planarized layer 51, color filter arrays 52R, 52G, 52B$_1$ and 52B$_2$ and light-suppressing layer 53 shown in FIG. 3.

The package 110 has a bottom portion 111 and sidewall portions 112 made of light shielding material such as ceramics, and a lid portion not shown and omitted. The inner space of the package 110 has an elongated shape as viewed in plan from the lid portion side.

A plurality of lead electrodes 115 made of 42-alloy (iron-nickel alloy) or the like extend from the inner space of the package 110 to the outside thereof in opposite end areas along the longitudinal direction.

Each of the lead electrodes 115 is electrically connected by a bonding wire 120 made of Al or the like to a predetermined bonding pad 40 of the LIS chip 100. One end of each bonding wire 120 is connected to a corresponding one of the lead electrodes 115, and the other end is connected to a corresponding one of the bonding pads 40. Connection of the bonding wire 120 to the lead electrode 115 or bonding pad 40 is established, for example, by ultrasonic bonding or ball bonding. One lead electrode may be connected to a plurality of bonding pads, or one bonding pad may be connected to a plurality of lead electrodes.

Both of the lead electrodes 115 and bonding pads 120 are formed outer than the image pickup section 10 of the LIS chip 100 along the longitudinal direction of the semiconductor substrate 1, as viewed in plan.

Each bonding wire 120 is therefore formed outer than the image pickup section 10 along the longitudinal direction of the semiconductor substrate 1.

Figure 6:
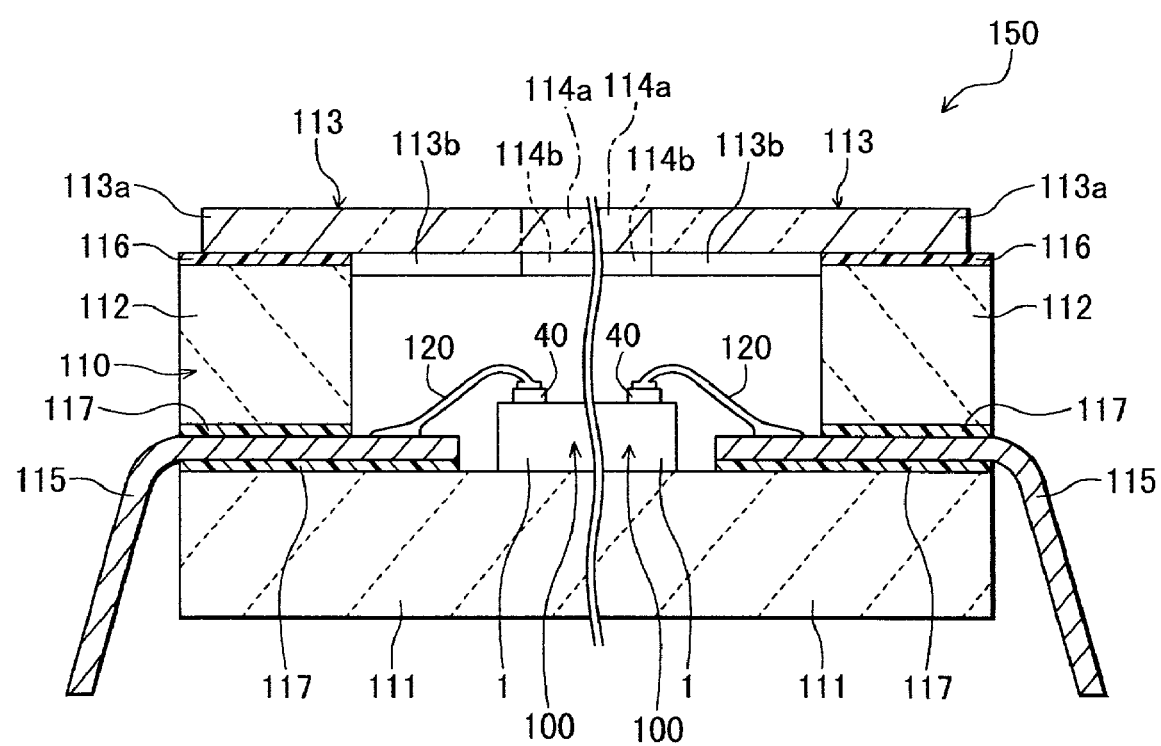
FIG. 6 is a schematic cross sectional view taken along line VI-VI shown in FIG. 5.

FIG. 6 is a schematic cross sectional view taken along line VI-VI shown in FIG. 5. In the LIS chip 100 shown in FIG. 6, the passivation layer, planarized layer, each color filter array and light-suppressing layer are also not shown and omitted in this area. In FIG. 6, the lid portion not shown and omitted in FIG. 5 is drawn.

The lid portion 113 has a transparent glass plate 113a and a light shielding member 113b disposed on the inner surface of the glass plate 113a.

For example, the light shielding member 113b is a light shielding plate or layer having an opening 114b over the image pickup section 10 (refer to FIG. 5) of the LIS chip 100. The shielding member 113b is made of, for example, an aluminum plate having an aluminum oxide coating on the surface thereof or a black painted metal or plastic plate.

The image pickup section 10 can be accommodated as viewed in plan in the opening 114b. A portion of the glass plate 113a constituting the lid portion 113 over the opening 114b functions as a window 114a of the package 110. A distance between the lower surface of the window 114a and the upper surface of the semiconductor substrate 1 of the LIS chip 100 is approximately in a range of 0.5 to 3.0 mm.

The lid portion 113 is fixed on the sidewall portions 112, for example, by adhesive 116. The sidewall portions 112 and bottom portion 111 are adhered together by adhesive 117, with a predetermined number of lead electrodes 115 being held between the sidewall and bottom portions at predetermined positions.

From the same reason as that given in the description of the LIS chip 100, even if the dynamic range of an image reader utilizing the linear image sensor 150 is broadened, generation of noises can be suppressed without lowering the sensitivity.

The position of each bonding pad 40 of the LIS chip 100 and the positions of each lead electrode 115 and each bonding wire 120 of the linear image sensor 150 may be changed in accordance with the F number of an optical system of the image reader in which the linear image sensor 150 is to be assembled. These positions may also be changed in accordance with a distance between the lower surface of the window 114a and the upper surface of the semiconductor substrate 1 of the LIS chip 100 in the linear image sensor 150.

Figure 7:
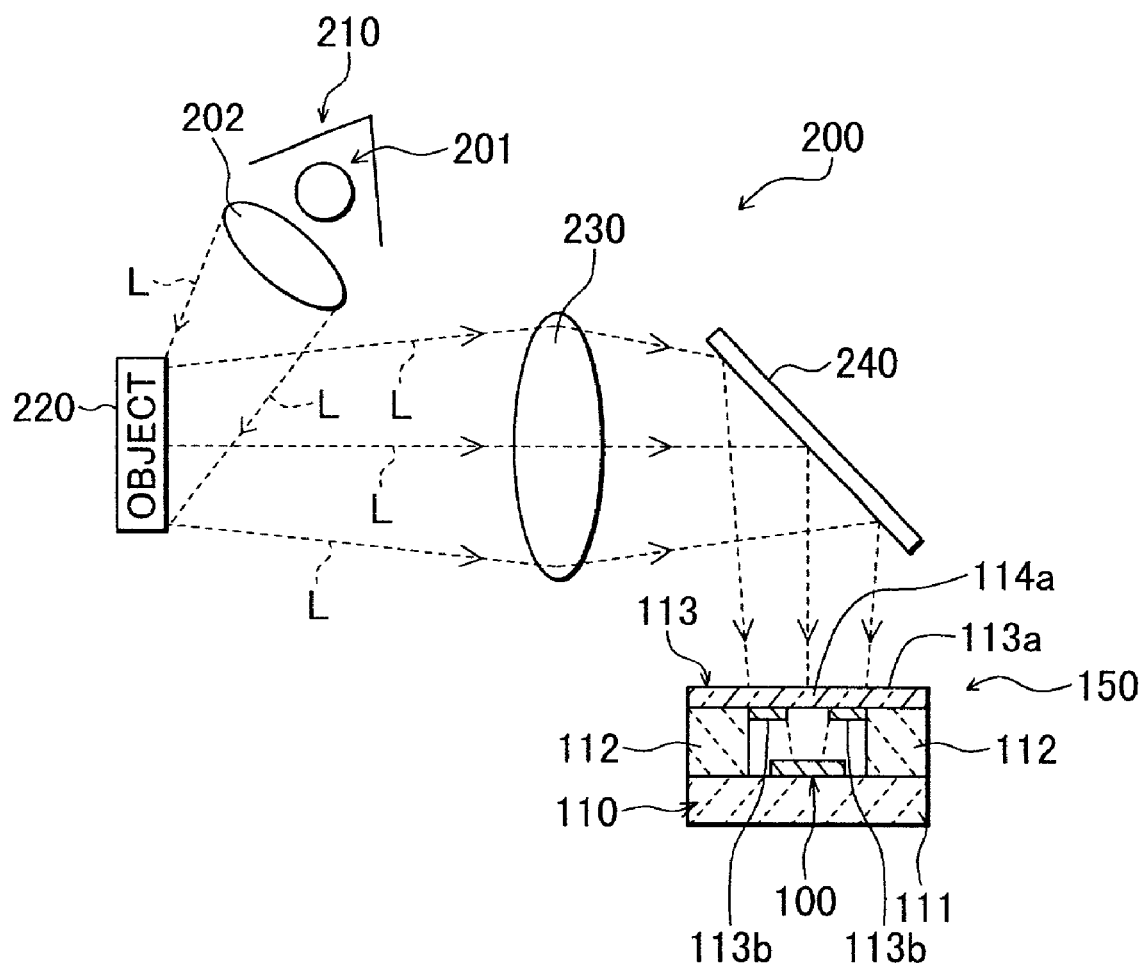
FIG. 7 is a schematic diagram showing an example of an optical system of an apparatus with a linear image sensor being assembled.

FIG. 7 is a schematic diagram showing an example of an optical system of an image reader assembled with the linear image sensor 150.

In the optical system 200 shown in FIG. 7, light L emitted from a lamp house 210 constituted of a light source 201 and an optical condenser lens 202 is reflected by an object 220, converged by an optical lens 230, and thereafter reflected by a mirror 240 to be incident upon the linear image sensor 150.

The light L reflected by the mirror 240 becomes incident upon the window 114a of the linear image sensor 150 and its nearby area. The light L incident upon the nearby area of the window 114a is reflected or absorbed by the light shielding member 113b and does not become substantially incident upon the inside of the linear image sensor 150. The light L incident upon the window 114a transmits through the window 114a and enters the linear image sensor 150. This light L transmits through various layers constituting the LIS chip 100 and reaches each photodiode and its nearby area.

Figure 8A:
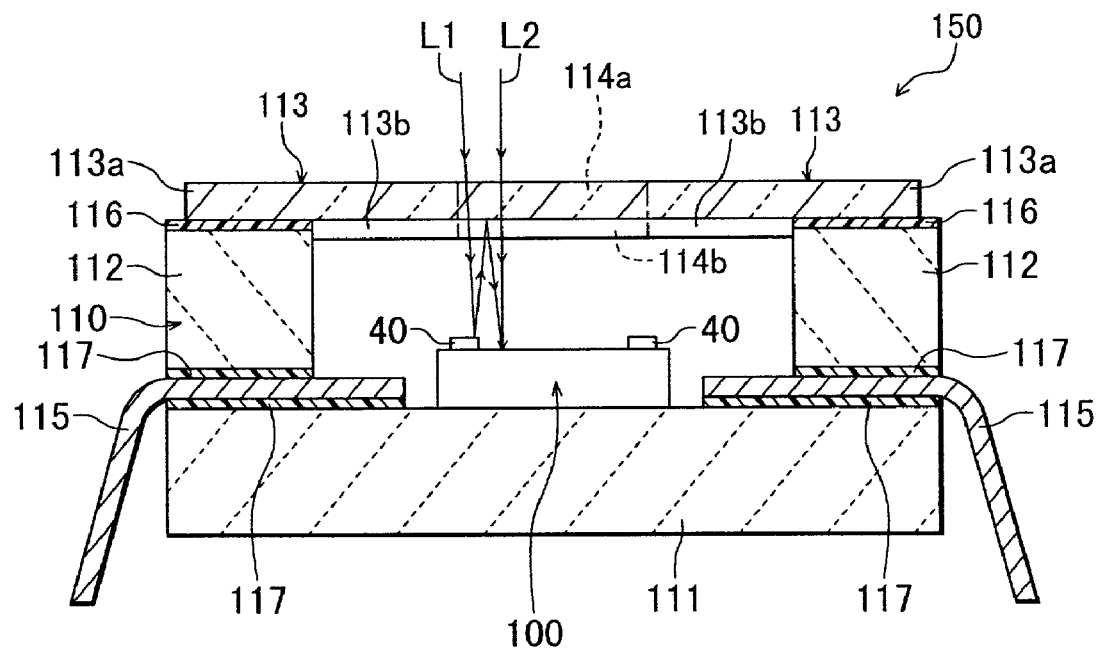
FIG. 8A is a cross sectional view illustrating the influence of light reflected at the surface of a bonding pad of a linear image sensor.

As shown in FIG. 8A, it is assumed that light L1 becomes incident upon the exposed surface of a bonding pad 40 and is reflected at the exposed surface, and thereafter the light L1 is again reflected at the lower or upper surface of the window 114a and becomes incident upon a photodiode. In this case, during one image read operation, a plurality of light beams L1 and L2 having different optical path of incidence enter some or all photodiodes. An image is formed also at a position different from the correct focusing position of the optical system 200. As a result, noises are superposed on a picture or image reproduced from an output of the linear image sensor 150.

Figure 8B:
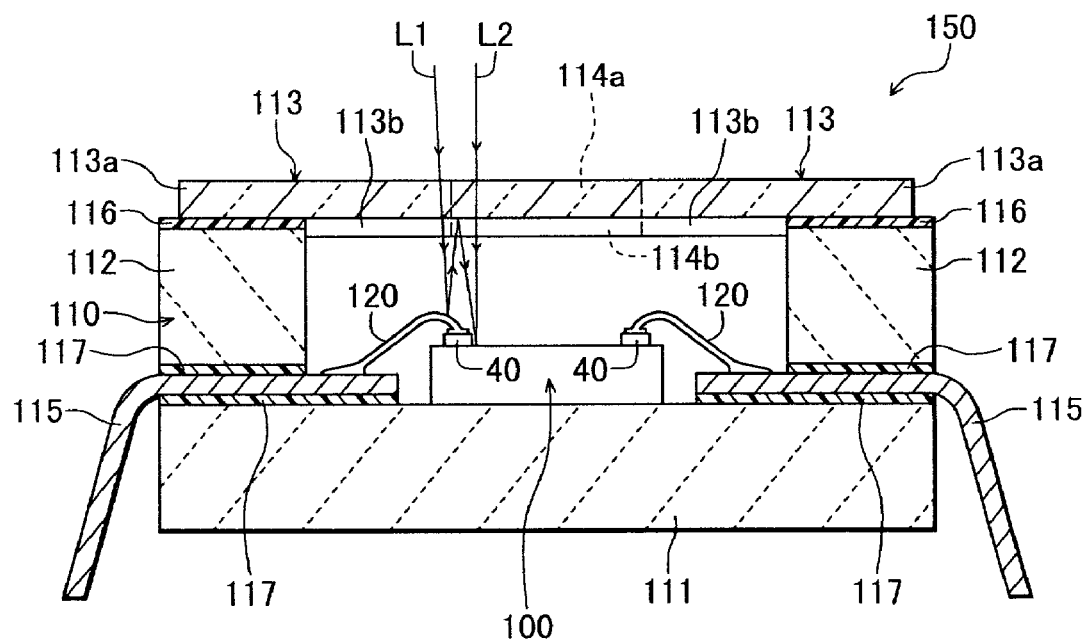
FIG. 8B is a cross sectional view illustrating the influence of light reflected at the surface of a bonding wire of a linear image sensor.

As shown in FIG. 8B, this case is also applied to a case wherein light L1 becomes incident upon the surface of a bonding wire 120 and is reflected by the surface, and thereafter the light L1 is again reflected at the lower or upper surface of the window 114a and becomes incident upon a photodiode.

If the F number of the optical lens 230 of the optical system 200 is 4, the maximum incidence angle of the light L to the linear image sensor 150 is about 7 degrees.

If light having an incidence angle of 7 degrees reciprocates between two planes disposed in parallel up and down at a distance of 1.5 mm, then a lateral motion distance of the light per one reciprocation is about 0.4 mm.

This means that there is a high possibility of noises to be generated by light reflection in a circumference area of about 0.4 mm of a photodiode, if the F number of the optical lens 230 is 4 and a distance between the lower surface of the window 114a and the upper surface of the semiconductor substrate of the LIS chip 100 is 1.5 mm.

For example, if a bonding pad having an exposed surface is positioned in a circumference area of about 0.4 mm of a photodiode, there is a high possibility of noises to be generated by light reflection at the bonding pad.

A preferable shortest horizontal distance L between a photodiode provided at the end portion in the longitudinal direction of the photodiode group and the nearest bonding pad having an exposed surface is roughly represented by a formula $L \geq d/F$. The term "d" represents a distance between the lower surface of the window 114a and the upper surface of the semiconductor substrate of the LIS chip 100, and the term "F" represents F number of the optical system 200.

As shown in FIG. 6, the bonding wire 120 has a curved line whose apex is higher than the bonding pad 40. It is therefore conceivable that a possibility of noises to be generated by reflection light at the bonding wire is higher than a possibility of noises to be generated by reflection light at the bonding pad.

If the amount of stray light generated by reflection at the bonding pads, bonding wires or lead electrodes is, for example, about 0.072% of the amount of light (excepting stray light) incident upon a photodiode, the influence of stray light is about −63 dB. If the amount of stray light is, for example, about 0.12% of the amount of light (excepting stray light) incident upon a photodiode, the influence of stray light is about −58.5 dB.

Accordingly, it is preferable that the position of each bonding pad 40 of the LIS chip 100 and the positions of each lead electrode 115 and each bonding wire 120 of the linear image sensor 150 are changed in accordance with the F number of an optical system of the image reader in which the linear image sensor 150 is to be assembled. It is also preferable that these positions are changed in accordance with a distance between the lower surface of the window 114a and the upper surface of the semiconductor substrate 1 of the LIS chip 100 in the linear image sensor 150.

Next, an LIS chip according to another embodiment will be described with reference to FIG. 9.

Figure 9:
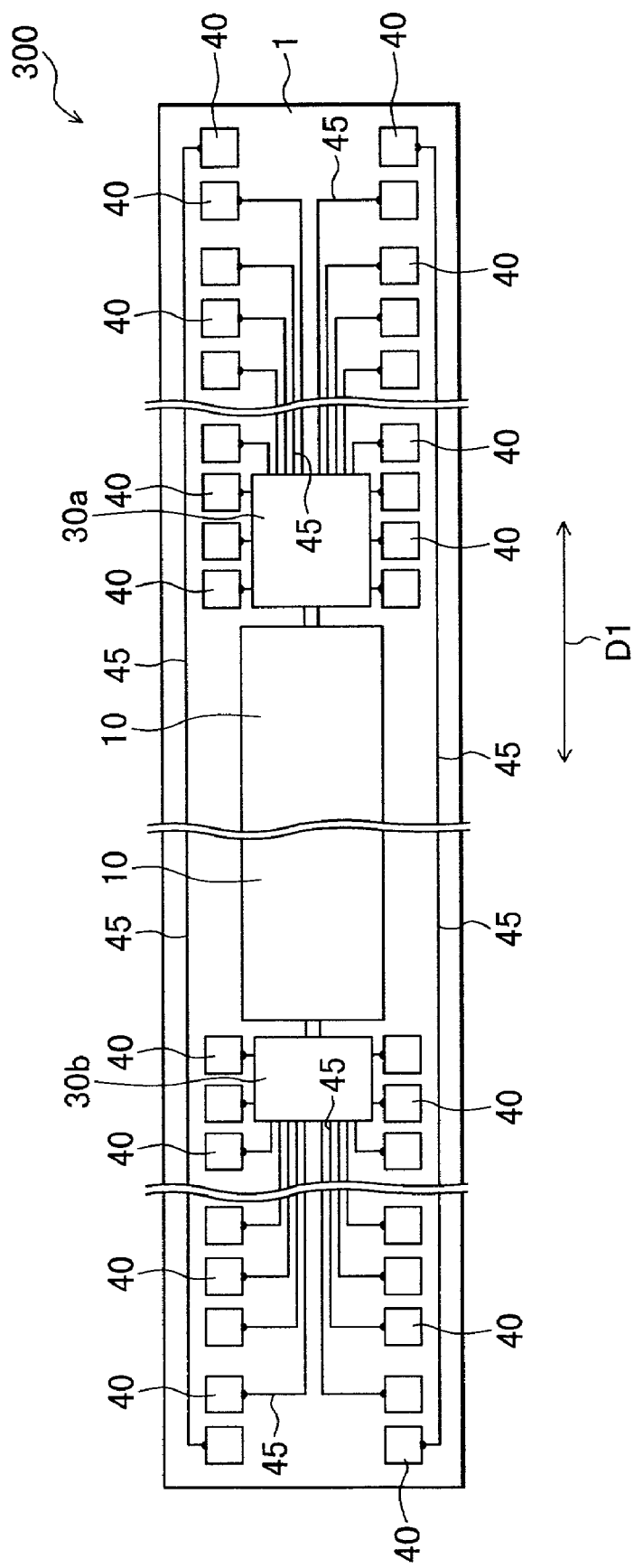
FIG. 9 is a schematic plan view showing an LIS chip according to another embodiment.

FIG. 9 is a schematic plan view of an LIS chip 300 according to the embodiment. All constituent elements shown in FIG. 9 are already shown in FIG. 1. The constituent elements are represented by using identical reference symbols to those used in FIG. 1, and the description thereof is omitted.

A different point of the LIS chip 300 shown in FIG. 9 from the LIS chip 100 shown in FIG. 1 resides in that some bonding pads 40 are disposed on both sides of the peripheral circuit sections 30a and 30b. The other structure is similar to the LIS chip 100 shown in FIG. 1.

Also in this LIS chip 300, all bonding pads 40 are formed outer than the photodiode groups (not shown) in the image pickup section 10 along the longitudinal direction D1 of the semiconductor substrate 1.

Although not shown in FIG. 9, also in the LIS chip 300, the light-suppressing layer and color filter arrays are formed over the semiconductor substrate 1. The layout of these light-suppressing layer and color filter arrays is similar to that of the light-suppressing layer and color filter arrays of the LIS chip 100 described earlier.

LIS chips and linear image sensors of the embodiments have been described above. The invention is not limited only to these embodiments.

For example, as the semiconductor substrate on which photodiodes and the like are formed, in place of an n-type semiconductor substrate with a p-type impurity diffused region being formed on one surface of the substrate, an n-type semiconductor substrate with a p⁻-type epitaxially grown semiconductor-layer being formed on one surface of the substrate may also be used.

Alternatively, an electrically insulating substrate with a desired conductivity type semiconductor-layer being formed on one surface of the substrate may be used. A desired conductivity type impurity diffused region is formed in the semiconductor-layer. Or, a desired conductivity type epitaxially grown layer is formed on the semiconductor-layer.

A p-type impurity concentration in p⁻-type semiconductor is lower than a p-type impurity concentration in p-type impurity diffused region.

In this specification, a "semiconductor substrate" is intended to include a substrate made of material other than semiconductor, which has a semiconductor layer formed on one surface and in which layer photodiodes are formed.

Although it is preferable that a photodiode is a buried type photodiode, photodiodes other than a buried type photodiode may also be used.

The number of photodiode groups to be formed in the image pickup section can be selected as desired in a range of about 1 to 4, in accordance with applications and the like of a LIS chip. Similarly, the number of photodiodes constituting one photodiode group can be selected as desired in a range of about 2,000 to 20,000.

The charge transfer element is generally made of a two-phase drive type CCD. A three-phase drive type CCD and a four-phase drive type CCD may also be used.

The charge transfer element may have either the readout gate electrode made of a discrete member different from the transfer electrodes or the transfer electrodes a portion of which serves also as the readout gate electrode.

Although an overflow drain may be omitted, it is preferable to use the overflow drain. The overflow drain may be either a horizontal type overflow drain or a vertical type overflow drain.

If a vertical overflow drain is used, an LIS chip may be formed by using an n-type semiconductor substrate having either a p-type impurity diffused region or a p⁻-type epitaxially grown layer, respectively formed on one surface of the substrate. The vertical overflow drain of the LIS chip can be obtained by adding the structure capable of applying a reverse bias between the n-type semiconductor substrate and the p-type impurity diffused region or p⁻-type epitaxially grown layer.

In an LIS chip having, for example, two photodiode groups, for taking a black and white image, a charge transfer element may be provided for each of the two photodiode groups and one output amplifier may be shared by the two charge transfer elements.

In addition to the output amplifier connected to the charge transfer element and a circuit for product test, the peripheral circuit sections may include a manufacture process test circuit, a mask alignment mark and the like, when necessary.

For an LIS chip for taking a color image, although it is preferable to use color filter arrays of primary colors, color filter arrays of complementary colors may also be used.

For an LIS chip for taking a black and white image, chromatic aberration can be reduced if a monochromatic color filter array is used. It is not essential to use a color filter array.

The package of a linear image sensor may have an integral body of bottom and sidewall portions. The package may be made of glass, synthetic resin or the like. It is not essential to use light shielding material for the lid portion. The lid portion may be formed without using light shielding material.

It is apparent that other various modifications, improvements, combinations, and the like can be made by those skilled in the art.

As described so far, according to the invention, it is possible to provide a linear image sensor hard to generate noises. It is therefore possible to provide an image reader hard to generate noises even if the dynamic range is broadened.

What we claim are:

1. A linear image sensor chip comprising:
   a semiconductor substrate having an elongated shape;
   an image pickup section formed on said semiconductor substrate, said image pickup section including (i) at least one photodiode group composed of a plurality of photodiodes formed only in a central area of a surface of said semiconductor substrate along a longitudinal direction of said semiconductor substrate and (ii) a charge transfer element provided for each said photodiode group;
   a peripheral circuit section formed in a peripheral area of said surface of said semiconductor substrate, said peripheral area being external to said central area in the longitudinal direction of the semiconductor substrate;
   a plurality of bonding pads formed on the surface of said semiconductor substrate externally, in the longitudinal direction, to the central area of the surface of the semiconductor substrate, each of said bonding pads having an exposed central surface area, wherein each of said bonding pads is disposed outer than said peripheral circuit section with respect to the longitudinal direction of said semiconductor substrate;
   a plurality of metal lines formed on the surface of said semiconductor substrate, each of said metal lines having an end connected to one of said bonding pads and another end connected to said peripheral circuit or said charge transfer element;
   a light-suppressing layer formed above said semiconductor substrate and covering a peripheral area of each of said plurality of photodiodes; and
   a passivation layer formed to cover an outer surface area of each of said bonding pads.

2. A linear image sensor chip according to claim 1, wherein said light-suppressing layer covers also said peripheral circuit section.

3. A linear image sensor chip according to claim 1, wherein said light-suppressing layer covers said metal lines at least in a region sideward along said at least one photodiode group.

4. A linear image sensor chip according to claim 1, wherein:
   said image pickup section includes four photodiode groups juxtaposed along a direction crossing the longitudinal direction;

said peripheral circuit section includes an output amplifier provided for each said charge transfer element and electrically connected to an output terminal of a corresponding charge transfer element; and the linear image sensor chip further comprises a color filter array disposed for each of three photodiode groups of said four photodiode groups, said color filter arrays generally constituting a multicolor color filter array necessary for taking a color image.

5. A linear image sensor chip according to claim 4, further comprising a color filter array disposed above remaining one of said four photodiode groups.

6. A linear image sensor chip according to claim 1, wherein said light-suppressing layer covers said metal lines at least in a region sideward along said at least one photodiode group and an edge portion of each of said bonding pads.

7. A linear image sensor, comprising:

a package including a bottom portion, sidewall portions and a lid portion generally defining an elongated inner space, and a plurality of lead electrodes, said lead electrodes extending from an end region of said elongated inner space, passing through said sidewall portions, and reaching an external space, said bottom portion and said sidewall portions being made of light shielding material and said lid portion having an elongated window made of transparent material;

a linear image sensor chip fixed in the inner space of said package, said linear image sensor chip including (1) a semiconductor substrate having an elongated shape along a direction generally coincident with the longitudinal direction of said bottom portion, (2) an image pickup section formed on said semiconductor substrate, said image pickup section including (i) at least one photodiode group composed of a plurality of photodiodes formed only in a central area of a surface of said semiconductor substrate along a longitudinal direction of said semiconductor substrate and (ii) a charge transfer element provided for each said photodiode group, (3) a peripheral circuit section formed in a peripheral area of said surface of the semiconductor substrate, said peripheral area being external to said central area in the longitudinal direction of said semiconductor substrate, (4) a plurality of bonding pads formed on the surface of said semiconductor substrate externally, in the longitudinal direction, to the central area of the surface of the semiconductor substrate, each of said bonding pads having an exposed central surface area, wherein each of said bonding pads is disposed outer than said peripheral circuit section with respect to the longitudinal direction of said semiconductor substrate, (5) a plurality of metal lines formed on the surface of said semiconductor substrate, each of said metal lines having an end connected to one of said bonding pads and another end connected to said peripheral circuit or said charge transfer element, (6) a light-suppressing layer formed above said semiconductor substrate and covering a peripheral area of each of said plurality of photodiodes covering a peripheral area of each of said plurality of photodiodes;

a passivation layer formed to cover an outer surface area of each of said bonding pads and of each of said bonding pads; and a plurality of bonding wires each electrically connecting one of said lead electrodes to a predetermined one of said bonding pads.

8. A linear image sensor according to claim 7, wherein all the bonding pads are formed on the surface of said semiconductor substrate outer than said at least one photodiode group with respect to the longitudinal direction of said semiconductor substrate.

9. A linear image sensor according to claim 7, wherein said light-suppressing layer covers also said peripheral circuit section.

10. A linear image sensor according to claim 7, wherein said light-suppressing layer covers in plan said metal lines at least in a region sideward along said at least one photodiode group.

11. A linear image sensor according to claim 7, wherein:

said image pickup section includes four photodiode groups juxtaposed along a direction crossing the longitudinal direction of said semiconductor substrate;

said peripheral circuit section includes an output amplifier provided for each said charge transfer element and electrically connected to an output terminal of a corresponding charge transfer element; and said linear image sensor chip further comprises a color filter array disposed for each of three photodiode groups of said four photodiode groups, said color filter arrays generally constituting a multicolor color filter array necessary for taking a color image.

12. A linear image sensor according to claim 11, further comprising a color filter array disposed above remaining one of said four photodiode groups.

13. A linear image sensor according to claim 7, wherein each said lead electrode is disposed outer than said image pickup section with respect to the longitudinal direction of said semiconductor substrate.

14. A linear image sensor according to claim 7, wherein each said lead electrode is disposed outer than said peripheral circuit section with respect to the longitudinal direction of said semiconductor substrate.

* * * * *